United States Patent
Perel et al.

(10) Patent No.: US 10,818,469 B2
(45) Date of Patent: Oct. 27, 2020

(54) CYLINDRICAL SHAPED ARC CHAMBER FOR INDIRECTLY HEATED CATHODE ION SOURCE

(71) Applicant: APPLIED Materials, Inc., Santa Clara, CA (US)

(72) Inventors: Alexander S. Perel, Danvers, MA (US); Jay T. Scheuer, Rowley, MA (US); Graham Wright, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/219,302

(22) Filed: Dec. 13, 2018

(65) Prior Publication Data

US 2020/0194220 A1    Jun. 18, 2020

(51) Int. Cl.
*H01J 37/08*    (2006.01)
*H01J 37/06*    (2006.01)

(52) U.S. Cl.
CPC ............. *H01J 37/08* (2013.01); *H01J 37/06* (2013.01); *H01J 2237/31701* (2013.01)

(58) Field of Classification Search
USPC ................... 250/492.21, 423 R, 426, 427
See application file for complete search history.

(56) References Cited

U.S. PATENT DOCUMENTS

| 8,324,841 | B2 | 12/2012 | Kleeven et al. |
| 2003/0085119 | A1 | 5/2003 | Davis et al. |
| 2003/0197129 | A1* | 10/2003 | Murrell .................. H01J 27/08 250/423 R |
| 2003/0218428 | A1* | 11/2003 | Maciejowski ........ H01J 27/022 315/111.81 |
| 2009/0014667 | A1* | 1/2009 | Hahto ................... H01J 27/205 250/492.21 |
| 2015/0303024 | A1 | 10/2015 | Harker et al. |
| 2016/0086759 | A1* | 3/2016 | Horsky .................. H01J 37/08 315/111.21 |
| 2017/0207054 | A1 | 7/2017 | Colvin et al. |

FOREIGN PATENT DOCUMENTS

| CN | 104752127 A | 7/2015 |
| CN | 205881868 U | 1/2017 |
| JP | 2010-192454 A | 9/2010 |

OTHER PUBLICATIONS

International Search Report and Written Opinion dated Apr. 10, 2020 in corresponding PCT application No. PCT/US2019/060865.

* cited by examiner

*Primary Examiner* — Kiet T Nguyen
(74) *Attorney, Agent, or Firm* — Nields, Lemack & Frame, LLC

(57) ABSTRACT

An indirectly heated cathode ion source having a cylindrical housing with two open ends is disclosed. The cathode and repeller are sized to fit within the two open ends. These components may be inserted into the open ends, creating a small radial spacing that provides electrical isolation between the cylindrical housing and the cathode and repeller. In another embodiment, the repeller may be disposed from the end of the cylindrical housing creating a small axial spacing. In another embodiment, insulators are used to hold the cathode and repeller in place. This design results in a reduced distance between the cathode column and the extraction aperture, which may be beneficial to the generation of ion beams of certain species.

18 Claims, 10 Drawing Sheets

CYLINDRICAL SHAPED ARC CHAMBER FOR INDIRECTLY HEATED CATHODE ION SOURCE

FIELD

Embodiments of the present disclosure relate to an indirectly heated cathode ion source, and more particularly, an indirectly heated cathode ion source having a cylindrical arc chamber.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller is typically disposed on the end of the arc chamber opposite the cathode. The cathode and repeller may be biased so as to repel the electrons, directing them back toward the center of the arc chamber. The electrons collide with a feed gas to create a plasma in the arc chamber. In some embodiments, a magnetic field is used to further confine the electrons within the arc chamber. An extraction aperture is disposed along one side, proximate the center of the arc chamber. Ions from the plasma are extracted through the extraction aperture.

It may be advantageous to maximize the beam current that is extracted from the arc chamber. This may result in lower source power, shorter processing times for the workpieces and better utilization of the ion implanter.

Therefore, any technique that increases the beam current extracted from an IHC ion source would be beneficial.

SUMMARY

An indirectly heated cathode ion source having a cylindrical housing with two open ends is disclosed. The cathode and repeller may be sized to fit within the two open ends. These components may be inserted into the open ends, creating a small radial spacing that provides electrical isolation between the cylindrical housing and the cathode and repeller. In another embodiment, the repeller may be disposed away from the end of the cylindrical housing creating a small axial spacing. In another embodiment, insulators are used to hold the cathode and repeller in place. This design results in a reduced distance between the cathode column and the extraction aperture, which may be beneficial to the generation of ion beams of certain species.

According to one embodiment, an indirectly heated cathode (IHC) ion source is disclosed. The IHC ion source comprises a cylindrical housing having a first open end and a second open end opposite the first open end; a cathode disposed in the first open end of the cylindrical housing, such that a front surface of the cathode is disposed in the cylindrical housing; and a repeller proximate the second open end, wherein the cylindrical housing, the cathode and the repeller define an arc chamber. In certain embodiments, wherein an inner diameter of the cylindrical housing is greater than an outer diameter of the cathode at all locations along a central axis of the cylindrical housing. In some embodiments, a radial spacing exists between the cathode and the cylindrical housing. In certain further embodiments, feedgas in the arc chamber escapes through the radial spacing. In some embodiments, a distance between the outer diameter of the cathode and the inner diameter of the cylindrical housing is less than 1 mm. In some embodiments, an outer diameter of the repeller is less than an inner diameter of the cylindrical housing such that the repeller is disposed in the second open end. In other embodiments, an outer diameter of the repeller is greater than an inner diameter of the cylindrical housing such that the repeller is disposed proximate the second open end, and the repeller is spaced apart from the second open end in an axial direction. In some further embodiments, the repeller is less than 1 mm from the second open end in the axial direction.

According to another embodiment, an indirectly heated cathode (IHC) ion source is disclosed. The IHC ion source comprises a cylindrical housing having a first open end and a second open end opposite the first open end; a cathode disposed in the first open end of the cylindrical housing; a cathode holder disposed at the first open end, the cathode holder comprising an insulating material contacting the cylindrical housing and the cathode to hold the cathode in place; and a repeller proximate the second open end. In certain embodiments, the cathode holder has an inner surface having a first inner diameter greater than an outer diameter of the cylindrical housing and a second inner diameter, less than the first inner diameter, wherein the cylindrical housing contacts the first inner diameter and the cathode contacts the second inner diameter. In certain embodiments, a front surface of the cathode extends into the cylindrical housing. In certain embodiments, the cathode holder has an outer surface having an outer diameter greater than an outer diameter of the cylindrical housing, an inner surface having an inner diameter, two sidewalls extending between the outer surface and the inner surface and a slot disposed in one of the sidewalls, wherein the cylindrical housing is disposed in the slot and the cathode contacts the inner surface. In certain embodiments, the IHC ion source comprises a repeller holder proximate the second open end, the repeller holder comprising an insulating material contacting the cylindrical housing and the repeller to hold the repeller in place.

According to another embodiment, an indirectly heated cathode (IHC) ion source is disclosed. The IHC ion source comprises a cylindrical housing having a first open end and a second open end opposite the first open end; a cathode disposed in the first open end of the cylindrical housing; a repeller proximate the second open end; and a repeller holder proximate the second open end, the repeller holder comprising an insulating material contacting the cylindrical housing and the repeller to hold the repeller in place. In some embodiments, an outer diameter of the repeller is equal to an outer diameter of the cylindrical housing, and an inner surface of the repeller holder contacts the cylindrical housing and the repeller. In some further embodiments, the inner surface comprises a protrusion to maintain an axial spacing between the repeller and the second open end of the cylindrical housing. In some embodiments, the repeller holder has an outer surface having an outer diameter greater than an outer diameter of the cylindrical housing, an inner surface having an inner diameter, two sidewalls extending between the outer surface and the inner surface and a slot disposed in one of the sidewalls, wherein the cylindrical housing is disposed in the slot and the repeller contacts the inner surface. In certain embodiments, the repeller has an outer diameter greater than the inner diameter of the repeller holder, and further comprising a notch disposed in the inner surface, and wherein the repeller is disposed in the notch.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
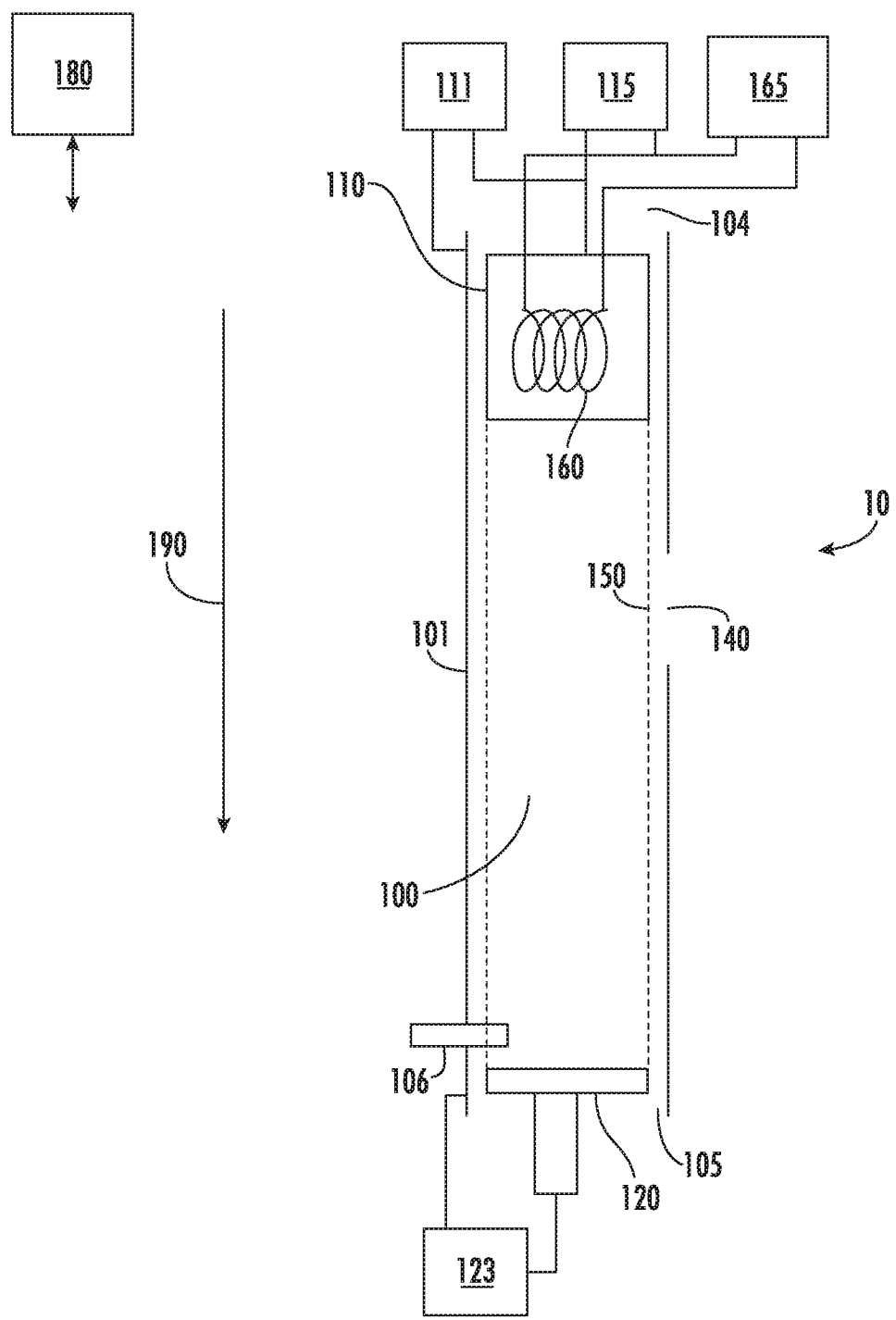
FIG. 1 is a schematic representation of an indirectly heated cathode (IHC) ion source that can be employed in all embodiments.

As described above, any technique that increases the beam current extracted from an IHC ion source may be beneficial. One approach to increase beam current is to reduce the distance between the plasma within the arc chamber and the extraction aperture. FIG. 1 shows a schematic representation of an IHC ion source 10. Each of the embodiments described herein may include the electrical components shown in FIG. 1.

The IHC ion source 10 includes an arc chamber 100, which is partly defined by a cylindrical housing 101 having two open ends, a first open end 104 and a second open end 105, opposite the first open end 104. The cylindrical housing 101 has a central axis which is parallel to the X direction. Orthogonal to the central axis are the Y and Z directions. According to convention, the ions are extracted in the Z direction.

The term "open end" denotes that the inner diameter of the cylindrical housing 101 at all positions along its central axis is greater than the outer diameter of the cathode 110. In other words, there are no end caps or other structures on the ends of the cylindrical housing 101.

The cylindrical housing 101 may be constructed of an electrically conductive material. The electrically conductive material may be a metal, such as tungsten. In some embodiments, a liner may be disposed proximate the interior surface of the cylindrical housing 101. The liner may cover an entirety of the cylindrical housing 101, such that the cylindrical housing 101 is not subjected to the harsh environment within the arc chamber 100.

A cathode 110 is disposed in the arc chamber 100 at a first open end 104 of the cylindrical housing 101. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the cylindrical housing 101, such as by arc power supply 111. In certain embodiments, the cylindrical housing 101 is connected to electrical ground.

At the second open end 105, which is opposite the first open end 104, a repeller 120 may be disposed. The repeller 120 may be biased relative to the cylindrical housing 101 by means of a repeller bias power supply 123. In other embodiments, the repeller 120 may be electrically connected to the cylindrical housing 101, so as to be at the same voltage as the cylindrical housing 101 of the arc chamber 100. In these embodiments, repeller bias power supply 123 may not be employed and the repeller 120 may be electrically connected to the cylindrical housing 101 of the arc chamber 100. In certain embodiments, the repeller 120 may be biased at the same potential as the cathode 110. In these embodiments, a repeller bias power supply 123 may not be employed and the arc power supply 111 may be used to bias the cathode 110 and the repeller 120. In other embodiments, the repeller 120 is electrically floating, such that a repeller bias power supply 123 is not used and the repeller 120 is not electrically connected to the cylindrical housing 101 or the cathode 110.

The cathode 110 and the repeller 120 are each made of an electrically conductive material, such as a metal or graphite. The cylindrical housing 101, the cathode 110 and the repeller 120 define the arc chamber 100.

In certain embodiments, there is a magnetic field 190 within the arc chamber 100. This magnetic field 190 may be generated by magnets or coils external to the arc chamber 100. This magnetic field 190 is intended to confine the electrons along one direction. The magnetic field 190 typically runs parallel to the central axis of the cylindrical housing 101 from the first open end 104 to the second open end 105. For example, electrons may be confined in a column that is parallel to the direction from the cathode 110 to the repeller 120 (i.e. the X direction).

Disposed on the cylindrical housing 101 may be an extraction aperture 140. The extraction aperture 140 may be dimensioned so as to be much longer in one dimension. This dimension is parallel to the central axis of the cylindrical housing 101. Thus, the extraction aperture 140 may appear as a slot. Further, the IHC ion source 10 also comprises a gas inlet 106 through which a source gas to be ionized may be introduced to the arc chamber 100.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100, which may be more positive than the cathode 110. These electrons collide with the molecules of source gas that are fed into the arc chamber 100 through the gas inlet 106. The source gas may be any desired species. The combination of electrons from the cathode 110, the source gas and the positive potential creates a plasma. In certain embodiments, the electrons may be somewhat confined by the magnetic field 190. The ions from the plasma can then be extracted through the extraction aperture 140 and used to prepare an ion beam.

The plasma is usually located within the cathode column. In certain embodiments, the cathode 110 and the repeller 120 have the same size and shape and are aligned with each other. The cathode column is defined as the volume between the front surface of the cathode 110 and the front surface of the repeller 120. If the cathode and repeller have circular front surfaces, the cathode column 150 is defined as a cylinder that extends from the cathode 110 to the repeller 120.

To maximize the beam current extracted through the extraction aperture 140, it may be beneficial to minimize the distance between the cathode column 150 and the extraction aperture 140.

Figure 2A:
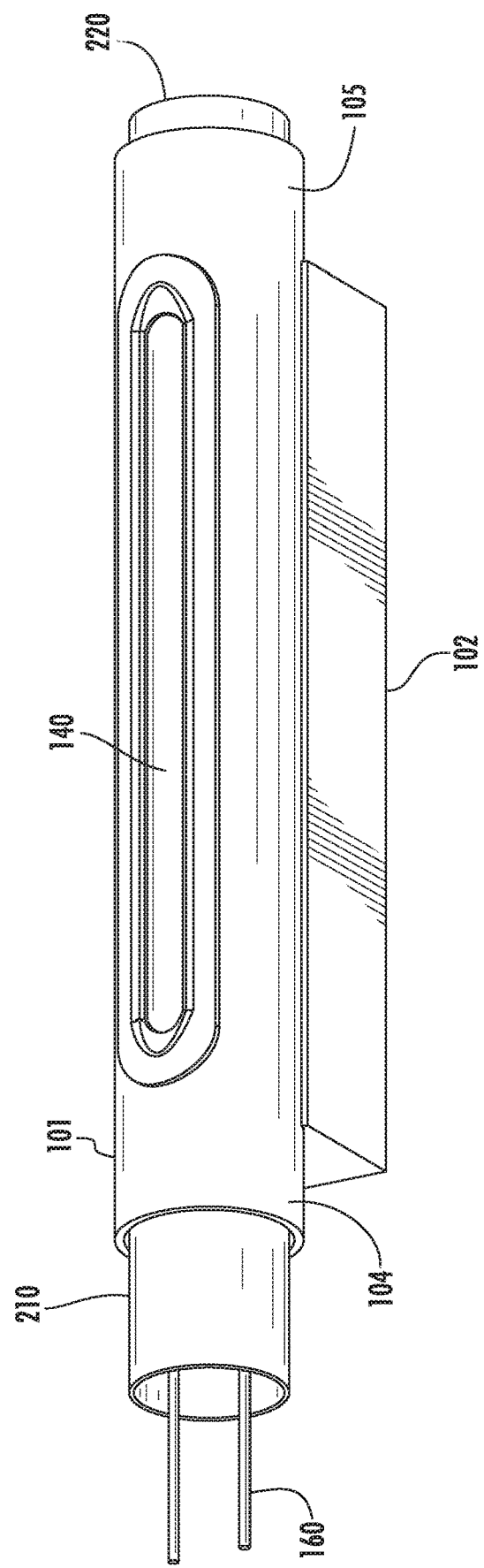
FIG. 2A is an indirectly heated cathode (IHC) ion source according to one embodiment.
Figure 2B:
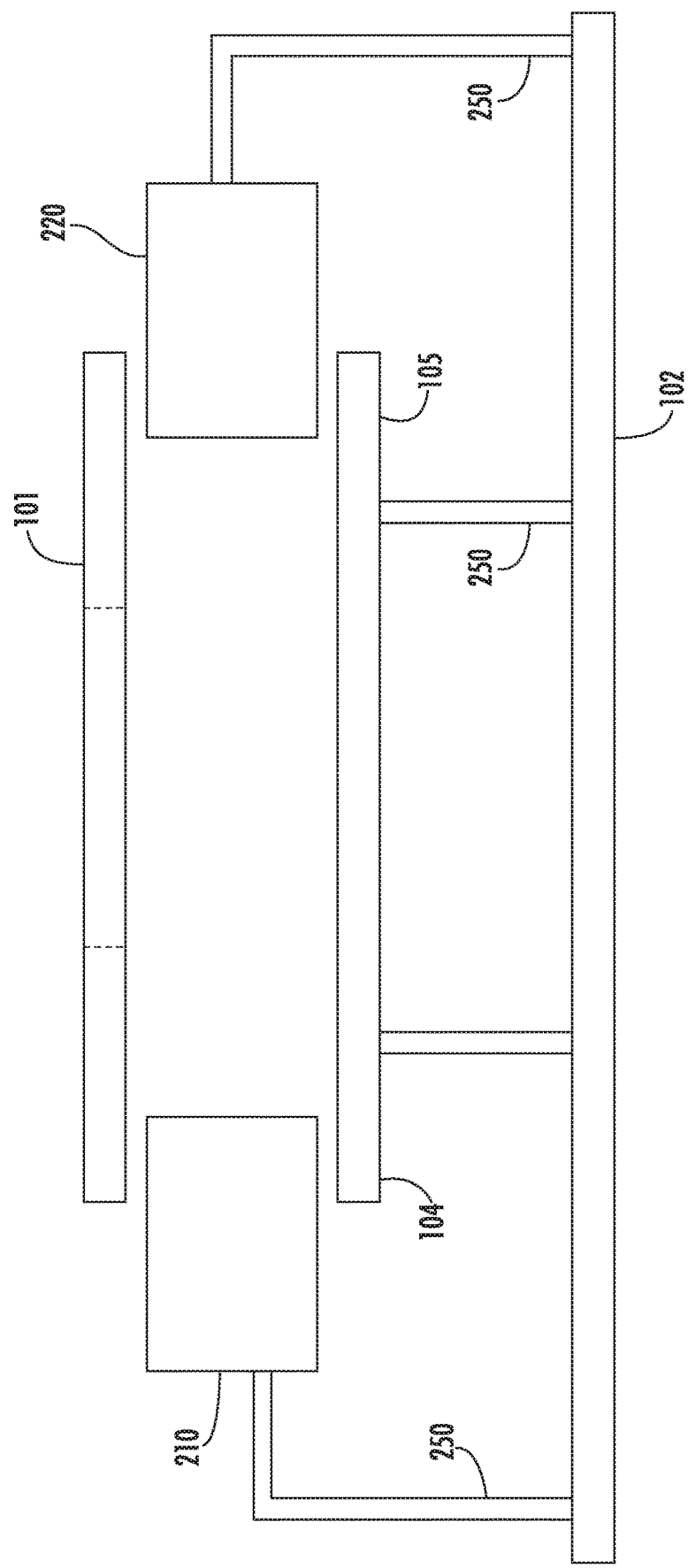
FIG. 2B shows a cross-sectional view of the IHC ion source of FIG. 2A.

FIGS. 2A-2B show a first embodiment of an IHC ion source that minimizes the distance between the cathode column 150 and the extraction aperture 140. FIG. 2A is a perspective view, while FIG. 2B is a cross-sectional view of the IHC ion source. Some of the components described with respect to FIG. 1 are not included in this figure for clarity.

The cylindrical housing 101 may be mounted on a base 102, which holds the cylindrical housing 101 in place. The cylindrical housing 101 also has an extraction aperture 140, which may be in the form of an elongated slot.

In this embodiment, the cathode 210 is inserted into the first open end 104 of the cylindrical housing 101. The cathode 210 is dimensioned such that its outer diameter is slightly smaller than the inner diameter of the cylindrical housing 101. In certain embodiments, the diameter of the cathode 210 may be between 12 mm and 20 mm. Thus, a spacing is formed in the radial direction between the cathode 210 and the cylindrical housing 101, where the radial direction is defined to be any direction perpendicular to the central axis of the cylindrical housing 101.

The radial spacing between the cathode 210 and the cylindrical housing 101 is large enough that arcing does not occur between these two components. Additionally, the radial spacing between the cathode 210 and the cylindrical housing 101 is small enough to minimize the amount of source gas that escapes through the first open end 104. For example, in certain embodiments, the spacing between the outer surface of the cathode 210 and the inner surface of the cylindrical housing 101 may be less than 1 mm. Simulations shows that, if the radial spacing is less than 1 mm, the amount of source gas that escapes through this radial spacing may be less than 10% of the total amount of gas.

The repeller 220 is similarly inserted into the second open end 105 of the cylindrical housing 101. Like the cathode 210, in this embodiment, the repeller 220 is dimensioned such that its outer diameter is slightly smaller than the inner diameter of the cylindrical housing 101. The radial spacing between the repeller 220 and the cylindrical housing 101 is large enough that arcing does not occur between these two components. Additionally, the radial spacing between the repeller 220 and the cylindrical housing 101 is small enough to minimize the amount of source gas that escapes through the second open end 105. For example, in certain embodiments, the outer diameter of the repeller 220 is less than 1 mm smaller than the inner dimension of the cylindrical housing 101.

In this embodiment, the cylindrical housing 101, the cathode 210 and the repeller 220 may be held in place using clamps 250 that are attached to the base 102. In one embodiment, the clamps 250 may be metal and may be attached to an insulating material that is attached to the base 102. In this way, the base 102 is electrically isolated from these components, and the components are electrically isolated from one another.

Figure 3A:
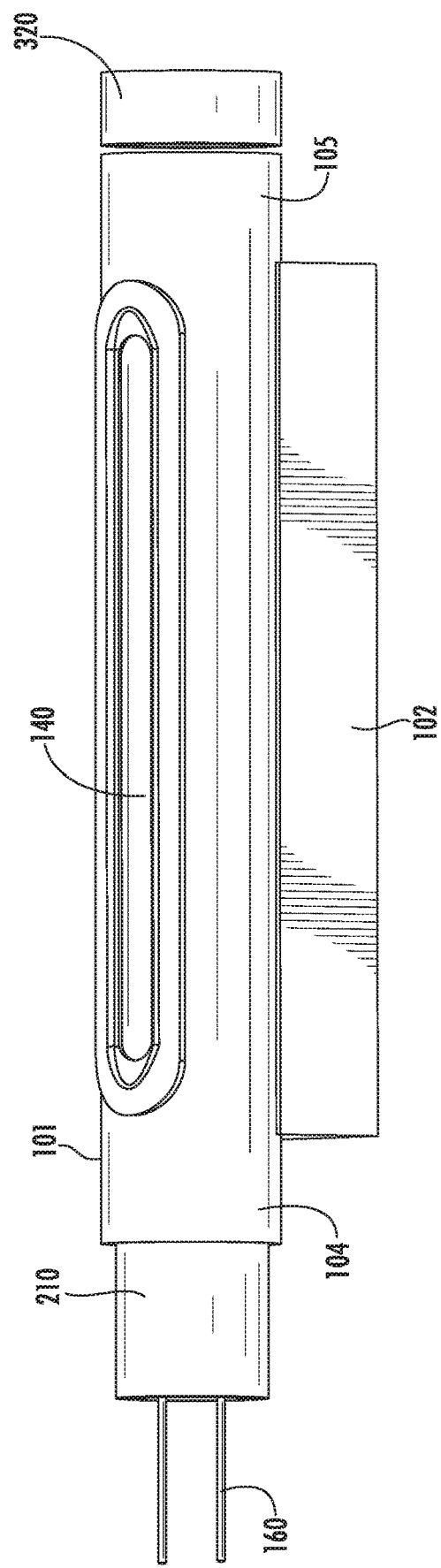
FIG. 3A is an indirectly heated cathode (IHC) ion source according to another embodiment.
Figure 3B:
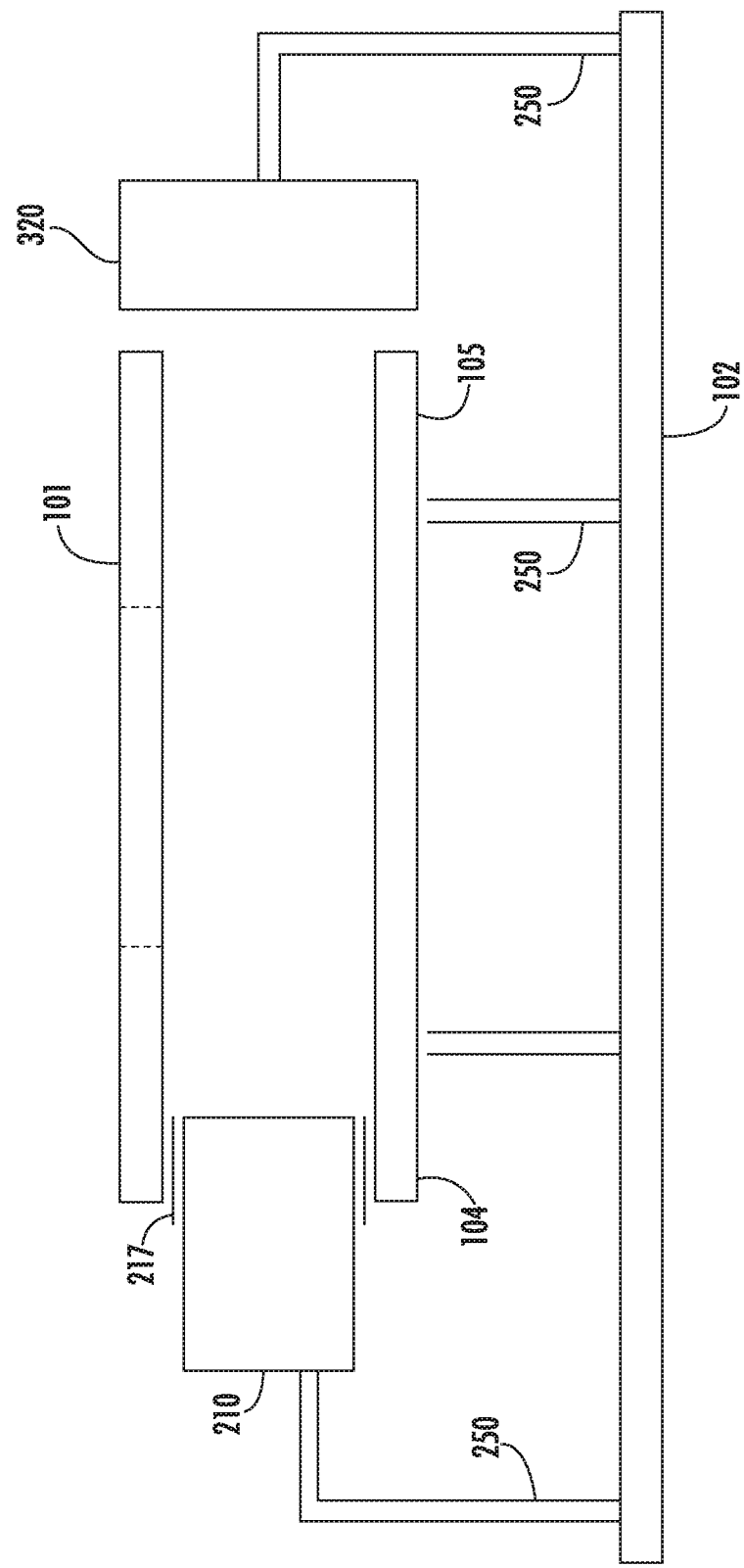
FIG. 3B shows a cross-sectional view of the IHC ion source of FIG. 3A.

FIGS. 3A-3B show a second embodiment of an IHC ion source that minimizes the distance between the cathode column 150 and the extraction aperture 140. FIG. 3A is a perspective view, while FIG. 3B is a cross-sectional view of the IHC ion source. Some of the components described with respect to FIG. 1 are not included in this figure for clarity.

The cylindrical housing 101 may be mounted on a base 102, which holds the cylindrical housing 101 in place. The cylindrical housing 101 also has an extraction aperture 140, which maybe in the form of an elongated slot.

In this embodiment, like that shown in FIG. 2, the cathode 210 is inserted into the first open end 104 of the cylindrical housing 101. The cathode 210 is dimensioned such that its outer diameter is slightly smaller than the inner diameter of the cylindrical housing 101 to create a radial spacing, as described above.

In this embodiment, the repeller 320 is disposed outside the second open end of the cylindrical housing 101. In this embodiment, the repeller 320 is dimensioned such that its outer diameter is at least as large as the inner diameter of the cylindrical housing 101. In certain embodiments, to minimize the amount of gas that escapes, the outer diameter of the repeller 320 is at least as large as the outer diameter of the cylindrical housing 101. The spacing between the repeller 220 and the cylindrical housing 101 is in the axial direction, defined as the direction parallel to the central axis of the cylindrical housing 101. This axial spacing is large enough that arcing does not occur between these two components. Additionally, the axial spacing between the repeller 220 and the cylindrical housing 101 is small enough to minimize the amount of source gas that escapes through the second open end 105. For example, in certain embodiments, the front surface of the repeller 220 is less than 1 mm from the second open end 105 of the cylindrical housing 101.

In this embodiment, the cylindrical housing 101, the cathode 210 and the repeller 320 may be held in place using clamps 250 that are attached to the base 102. The clamps 250 may be metal and may be attached to an insulating material that is attached to the base 102. In this way, the base 102 is electrically isolated from these components, and the components are electrically isolated from one another.

In certain embodiments, a shield 217 may be inserted between the cathode 210 and the cylindrical housing 101. The shield 217 may be a thin cylinder having an inner diameter greater than the outer diameter of the cathode 210 and an outer diameter smaller than the inner diameter of the cylindrical housing 101. This shield 217 is electrically conductive and is biased at the same voltage of the cathode 210, such as by the arc power supply 111. Since the shield 217 is at the same voltage as the cathode 210, electrons emitted from the cathode 210 are not attracted toward the shield 217. This may reduce the flow of electrons in the radial direction. Further, since it is physically separate from the cathode 210, the shield 217 is at a lower temperature, and less likely to emit any electrons. This shield 217 may also be employed with any of the other embodiments described herein.

Figure 4:
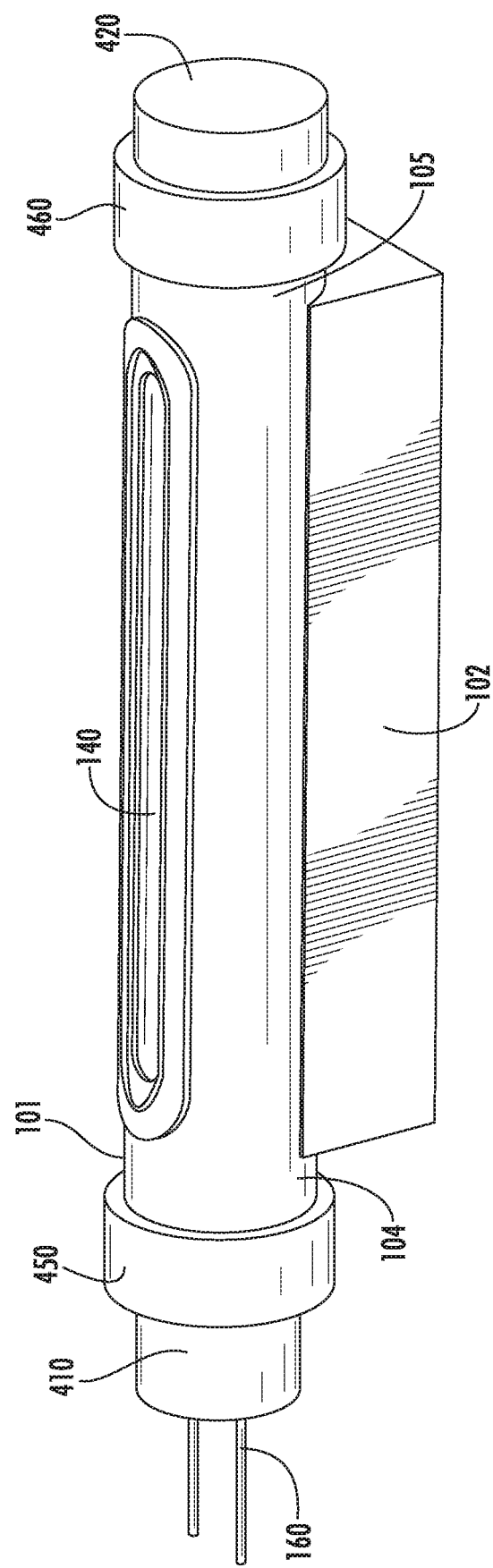
FIG. 4 is an indirectly heated cathode (IHC) ion source according to a third embodiment.

FIG. 4 shows a third embodiment of an IHC source embodiment of an IHC ion source that minimizes the distance between the cathode column 150 (see FIG. 1) and the extraction aperture 140. Some of the components described with respect to FIG. 1 are not included in this figure for clarity.

The cylindrical housing 101 may be mounted on a base 102, which holds the cylindrical housing 101 in place. The cylindrical housing 101 also has an extraction aperture 140, which maybe in the form of an elongated slot.

In this embodiment, the cathode 410 is held in place by cathode holder 450. The cathode holder 450 is made from an insulating material and inserted over the first open end 104 of the cylindrical housing 101. The insulating material may be alumina or boron nitride, although other materials may also be used. The inner diameter of the cathode holder 450 may be approximately the same as the outer diameter of the cylindrical housing 101 so as to create a friction fit. In one embodiment, shown in cross-section in FIG. 5, the inner surface of the cathode holder 450 has two inner diameters; a first inner diameter 451, that is roughly the same dimension as the outer diameter of the cylindrical housing 101, and a second inner diameter 452 that is roughly the same dimension as the outer diameter of the cathode 410. In certain embodiments, the outer diameter of the cathode 410 is smaller than the outer diameter of the cylindrical housing 101, resulting in a step in the inner surface of the cathode holder 450. The cathode 410 may be held by the inner surface of the cathode holder, such as by a friction or interference fit. In this way, the cathode 410 may be disposed within the first open end 104 of the cylindrical housing 101 without the use of clamps or other fasteners. In this embodiment, a spacing is formed in the radial direction between the cathode 410 and the cylindrical housing 101 by the cathode holder 450.

The radial spacing between the cathode 410 and the cylindrical housing 101 is large enough that arcing does not occur between these two components. Additionally, because the cathode holder 450 is inserted over the first open end 104 of the cylindrical housing 101 and the cathode 410, the amount of source gas that escapes through the first open end 104 is minimal. As described above, the spacing in the radial direction may be less than 1 mm.

The repeller 220 is similarly held in place using repeller holder 460. The repeller holder 460 is also made of an insulating material and inserted over the second open end 105 of the cylindrical housing 101. The insulating material may be alumina or boron nitride, although other materials may also be used. Like the cathode holder 450, the repeller holder 460 is dimensioned such that the inner diameter of the inner surface is roughly the same as the outer diameter of the cylindrical housing 101. In one embodiment, the repeller 420 may have the same outer diameter as the cylindrical housing. In this embodiment, shown in FIG. 6, the repeller holder 460 may have a protrusion 461 on its inner surface to maintain spacing in the axial direction between the cylindrical housing 101 and the repeller 420.

Figure 5:
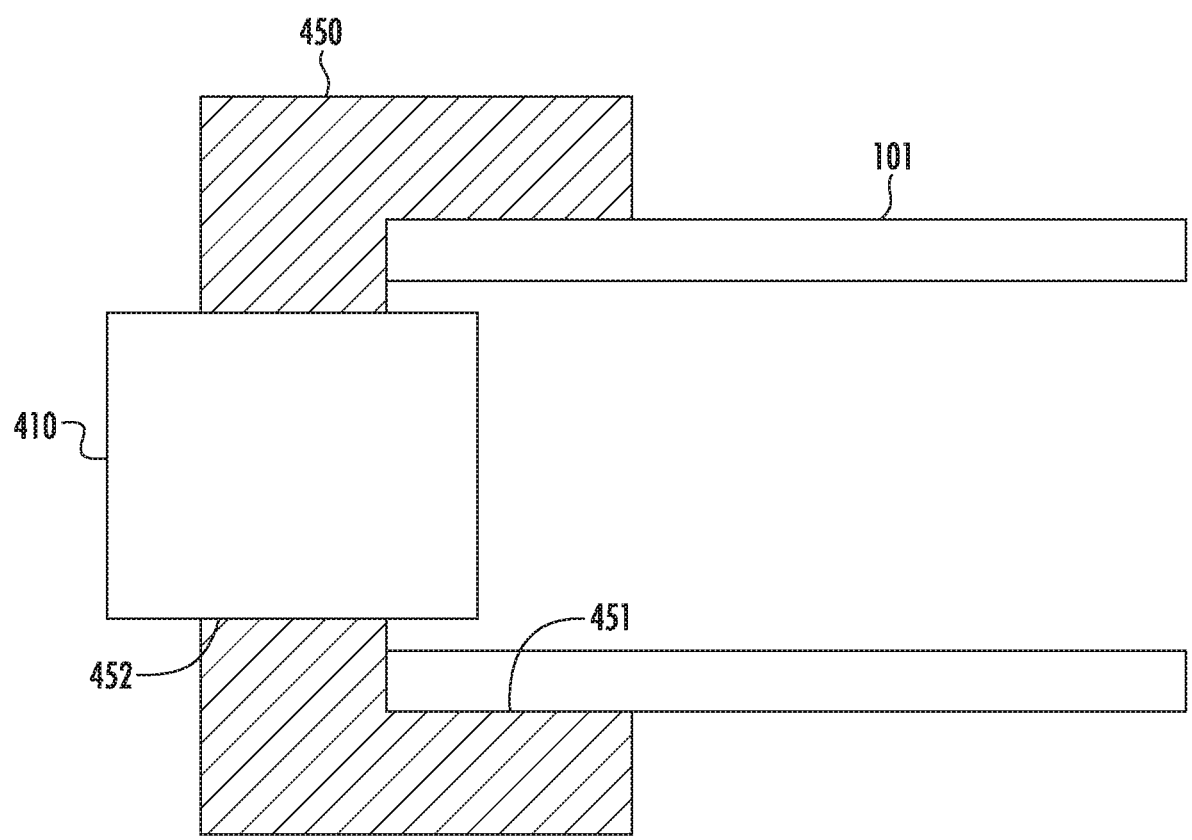
FIG. 5 shows a cathode holder according to one embodiment.
Figure 6:
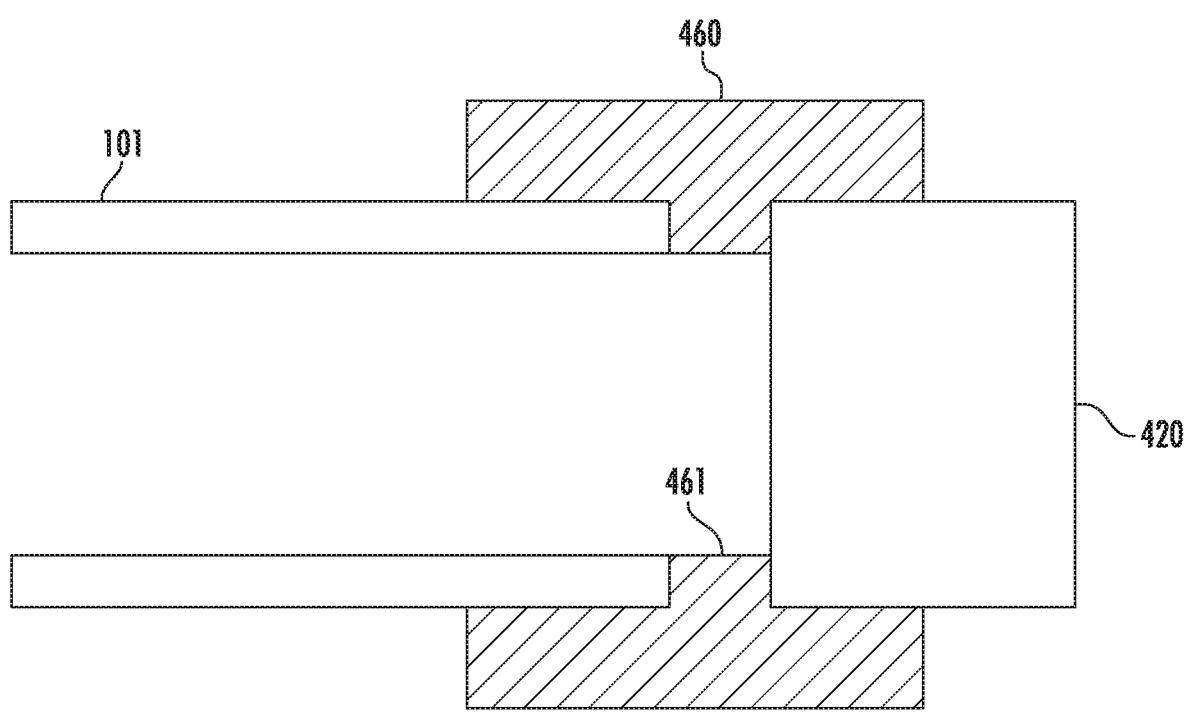
FIG. 6 shows a repeller holder according to one embodiment.

In certain embodiments, the cathode 410 may be held in place near the first open end 104 using a cathode holder 450 that is shaped like the repeller holder shown in FIG. 6. Additionally, in certain embodiments, the repeller 420 may be inserted into the second open end 105 using a repeller holder 460 that is shaped like the cathode holder 450 of FIG. 5.

In certain embodiments, crenellations may be added to the cathode holder 450 and the repeller holder 460 to mitigate electrical shorting.

Figure 7:
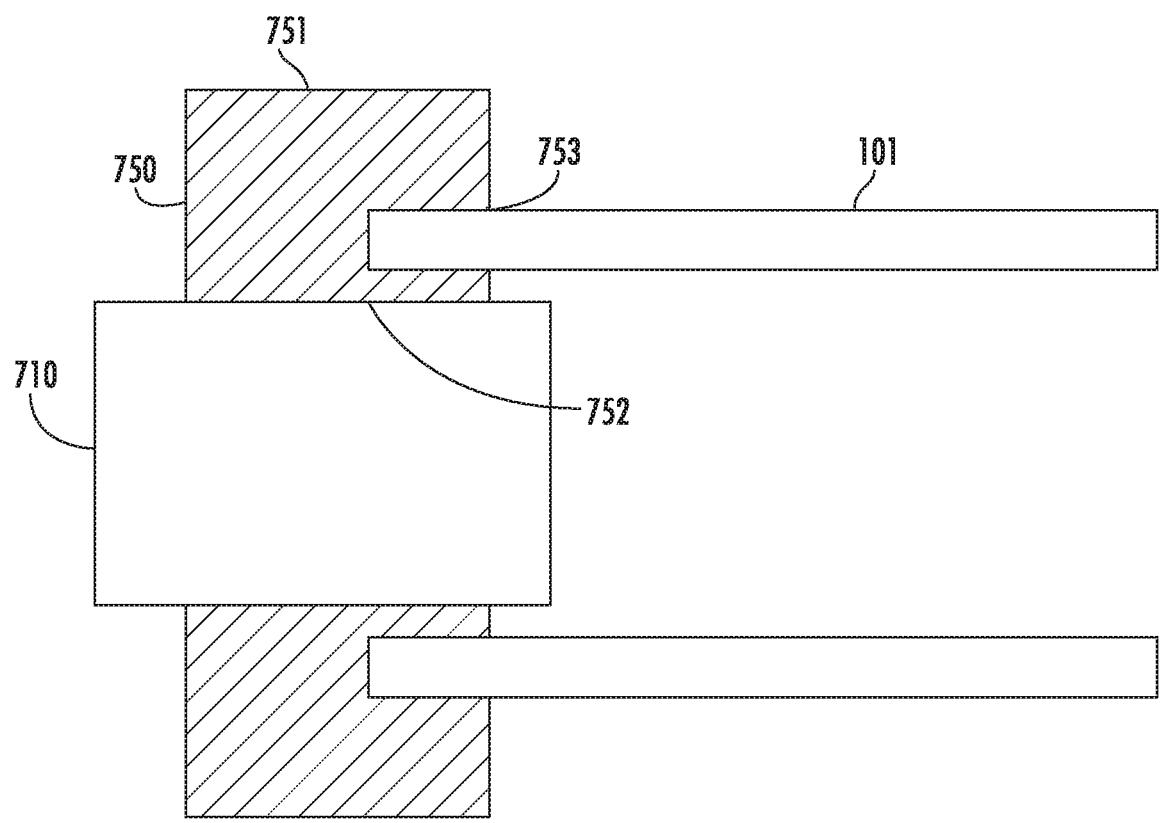
FIG. 7 shows a cathode holder according to another embodiment.

FIG. 7 shows another embodiment of a cathode holder 750. This cathode holder 750 is an annular ring having an outer surface and an inner surface. The outer diameter 751 is greater than the outer diameter of the cylindrical housing 101 and the inner diameter 752 is smaller than the inner diameter of the cylindrical housing 101 and approximately equal to the outer diameter of the cathode 710. Two sidewalls extend between the outer surface and the inner surface. The cathode holder 750 also includes a slot 753 disposed in one sidewall, which is closed on one end. The first open end 104 of the cylindrical housing 101 is slid into the slot 753. The width of the slot 753 is approximately equal to the width of the cylindrical housing 101.

The cathode 710 fits within the inner surface of the cathode holder 750, as was described with respect to cathode holder 450.

This cathode holder 750 may also perform the function of the shield 217 shown in FIG. 3B, in that it serves to reduce the flow of electrons from the cathode 710 to the cylindrical housing 101.

Note that in FIG. 5 and FIG. 7, the front surface of the cathode may extend into the cylindrical housing 101, while a remainder of the cathode extends out of the cylindrical housing 101.

Figure 8:
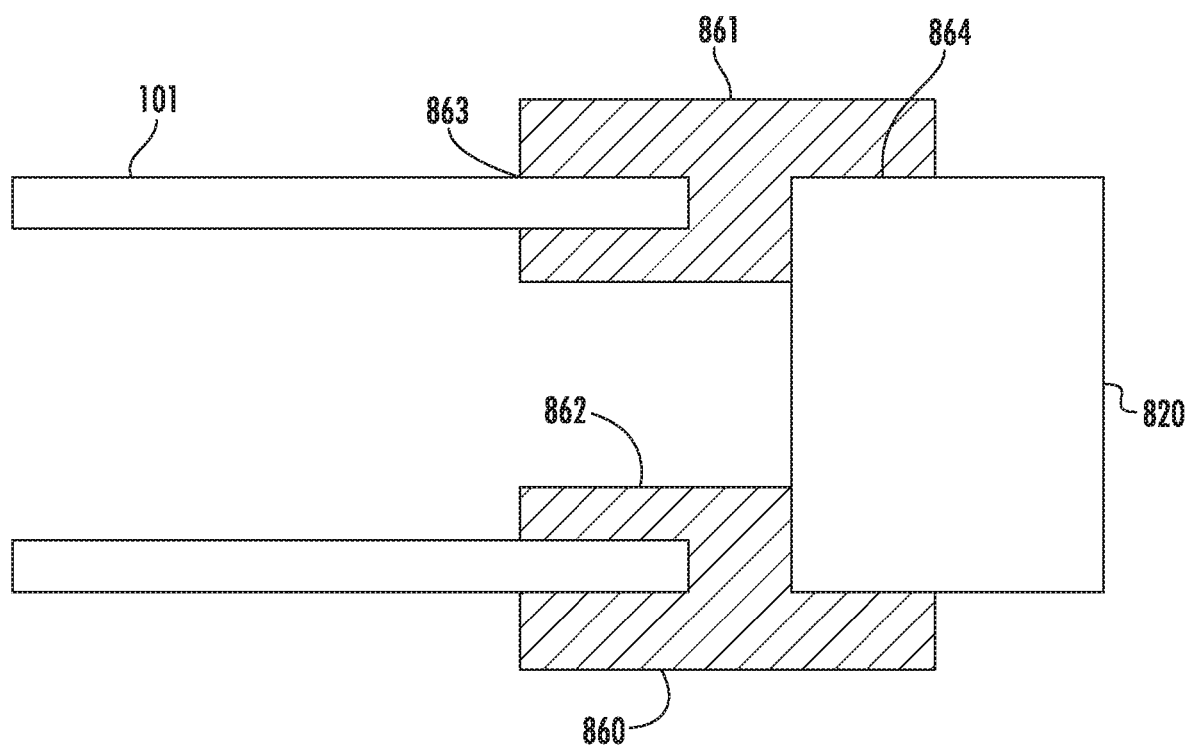
FIG. 8 shows a repeller holder according to another embodiment.

FIG. 8 shows another embodiment of a repeller holder 860. This repeller holder 860 is an annular ring having an outer surface and an inner surface. The outer diameter 861 is greater than the outer diameter of the cylindrical housing 101 and the inner diameter 862 is smaller than the inner diameter of the cylindrical housing 101. Two sidewalls extend between the inner surface and the outer surface. The repeller holder 860 also includes a slot 863 disposed in one sidewall, which is closed on one end. The second open end 105 of the cylindrical housing 101 is slid into the slot 863. The width of the slot 863 is approximately equal to the width of the cylindrical housing 101. In certain embodiments, the outer diameter of the repeller 820 is larger than the inner diameter of the repeller holder 860. In these embodiments, a notch 864 may be disposed within the inner surface of the repeller holder 860. This notch 864 allows a repeller which has a larger diameter than the inner diameter of the repeller holder 860 to be employed.

In certain embodiments, the cathode 710 may be held in place near the first open end 104 using a cathode holder 750 that is shaped like the repeller holder shown in FIG. 8. Additionally, in certain embodiments, the repeller 820 may be inserted into the second open end 105 using a repeller holder 860 that is shaped like the cathode holder 750 of FIG. 7.

In certain embodiments, crenellations may be added to the cathode holder 750 and the repeller holder 860 to mitigate electrical shorting.

Thus, in all of these embodiments, the ion source includes a cylindrical housing 101 having two open ends. Rather than utilizing end plates as is traditionally done, the cathode and the repeller of the present disclosure are sized so as to serve as the end plates. In other words, in the embodiments of FIG. 2 and FIG. 3, the cylindrical housing with two open ends, the cathode and the repeller define the arc chamber with no other components forming any portion of the arc chamber 100. In the embodiment of FIG. 4, the cathode holder 450 and the repeller holder 460 may also define the arc chamber 100.

The embodiments described above in the present application may have many advantages. First, the present system reduces the distance between the cathode column and the extraction aperture. In some testing, the beam current of certain species extracted from the IHC ion source increased with a reduction in this distance. For example, increases of 5% to 10% in beam current were demonstrated when an IHC ion source having a shorter distance was used. Additionally, the source power used to generate an ion beam of a particular current was reduced by between 5% and 15%. In one particular test, the beam current of phosphorus dimer ($P_2$) was increased by about 12% when the distance between the cathode column and the extraction aperture was reduced by 50%. Further, the source power used to generate the beam current was reduced by about 13% in this test. In another test, the beam current of boron difluoride ($BF_2$) was increased by about 7% when the distance between the cathode column and the extraction aperture was reduced by 50%. Further, the source power used to generate the beam current was reduced by about 7% in this test. Decreased source power for other species was also observed.

Further, the present system eliminates the end plates that are traditionally used with IHC ion sources. Additionally, liners, which are typically disposed against these end plates behind the cathode and repeller, are also no longer used. This reduces the cost and complexity of this IHC ion source.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode (IHC) ion source, comprising:
   a cylindrical housing having a first open end and a second open end opposite the first open end, wherein the cylindrical housing is metal;
   a cathode disposed in the first open end of the cylindrical housing, such that a front surface of the cathode is disposed in the cylindrical housing; and
   a repeller proximate the second open end, wherein the cylindrical housing, the cathode and the repeller define an arc chamber.

2. The IHC ion source of claim 1, wherein an inner diameter of the cylindrical housing is greater than an outer diameter of the cathode at all locations along a central axis of the cylindrical housing.

3. The IHC ion source of claim 2, wherein a radial spacing exists between the cathode and the cylindrical housing.

4. The IHC ion source of claim 3, wherein feedgas in the arc chamber escapes through the radial spacing.

5. The IHC ion source of claim 2, wherein a distance between the outer diameter of the cathode and the inner diameter of the cylindrical housing is less than 1 mm.

6. The IHC ion source of claim 1, wherein an outer diameter of the repeller is less than an inner diameter of the cylindrical housing such that the repeller is disposed in the second open end.

7. The IHC ion source of claim 1, wherein an outer diameter of the repeller is greater than an inner diameter of the cylindrical housing such that the repeller is disposed proximate the second open end, and the repeller is spaced apart from the second open end in an axial direction.

8. The IHC ion source of claim 7, wherein the repeller is less than 1 mm from the second open end in the axial direction.

9. An indirectly heated cathode (IHC) ion source, comprising
   a cylindrical housing having a first open end and a second open end opposite the first open end;
   a cathode disposed in the first open end of the cylindrical housing;
   a cathode holder disposed at the first open end, the cathode holder comprising an insulating material contacting the cylindrical housing and the cathode to hold the cathode in place; and
   a repeller proximate the second open end.

10. The IHC ion source of claim 9, wherein the cathode holder has an inner surface having a first inner diameter greater than an outer diameter of the cylindrical housing and a second inner diameter, less than the first inner diameter, wherein the cylindrical housing contacts the first inner diameter and the cathode contacts the second inner diameter.

11. The IHC ion source of claim 10, wherein a front surface of the cathode extends into the cylindrical housing.

12. The IHC ion source of claim 9, wherein the cathode holder has an outer surface having an outer diameter greater than an outer diameter of the cylindrical housing, an inner surface having an inner diameter, two sidewalls extending between the outer surface and the inner surface and a slot disposed in one of the two sidewalls, wherein the cylindrical housing is disposed in the slot and the cathode contacts the inner surface.

13. The IHC ion source of claim 9, comprising a repeller holder proximate the second open end, the repeller holder comprising an insulating material contacting the cylindrical housing and the repeller to hold the repeller in place.

14. An indirectly heated cathode (IHC) ion source, comprising
   a cylindrical housing having a first open end and a second open end opposite the first open end;
   a cathode disposed in the first open end of the cylindrical housing;
   a repeller proximate the second open end; and
   a repeller holder proximate the second open end, the repeller holder comprising an insulating material contacting the cylindrical housing and the repeller to hold the repeller in place.

15. The IHC ion source of claim 14, wherein an outer diameter of the repeller is equal to an outer diameter of the cylindrical housing, and an inner surface of the repeller holder contacts the cylindrical housing and the repeller.

16. The IHC ion source of claim 15, wherein the inner surface comprises a protrusion to maintain an axial spacing between the repeller and the second open end of the cylindrical housing.

17. The IHC ion source of claim 14, wherein the repeller holder has an outer surface having an outer diameter greater than an outer diameter of the cylindrical housing, an inner surface having an inner diameter, two sidewalls extending between the outer surface and the inner surface and a slot disposed in one of the two sidewalls, wherein the cylindrical housing is disposed in the slot and the repeller contacts the inner surface.

18. The IHC ion source of claim 17, wherein the repeller has an outer diameter greater than the inner diameter of the repeller holder, and further comprising a notch disposed in the inner surface, and wherein the repeller is disposed in the notch.

\* \* \* \* \*